(12) United States Patent
Kim et al.

(10) Patent No.: US 10,026,161 B2
(45) Date of Patent: Jul. 17, 2018

(54) APPARATUS AND METHOD FOR PERFORMING FOURIER TRANSFORM

(71) Applicants: SAMSUNG ELECTRONICS CO., LTD., Suwon-si (KR); University of Seoul Industry Cooperation Foundation, Seoul (KR)

(72) Inventors: Hojung Kim, Suwon-si (KR); Kichul Kim, Seoul (KR); Hongseok Lee, Seongnam-si (KR)

(73) Assignees: SAMSUNG ELECTRONICS CO., LTD., Suwon-si (KR); University of Seoul Industry Cooperation Foundation, Seoul (KR)

( * ) Notice: Subject to any disclaimer, the term of this patent is extended or adjusted under 35 U.S.C. 154(b) by 60 days.

(21) Appl. No.: 15/270,647

(22) Filed: Sep. 20, 2016

(65) Prior Publication Data
US 2017/0103503 A1    Apr. 13, 2017

(30) Foreign Application Priority Data
Oct. 13, 2015    (KR) .......................... 10-2015-0143044

(51) Int. Cl.
*G06T 5/10*    (2006.01)
*G11C 11/16*    (2006.01)
(Continued)

(52) U.S. Cl.
CPC ................ *G06T 5/10* (2013.01); *G03H 1/08* (2013.01); *G06F 17/142* (2013.01);
(Continued)

(58) Field of Classification Search
CPC ... G06T 5/10; G06T 2207/20056; G03H 1/08; G11C 11/1653; G11C 11/1673;
(Continued)

(56) References Cited

U.S. PATENT DOCUMENTS 6,172,935 B1 * 1/2001 Wright ................ G11C 7/1072
                                                              365/194
7,095,648 B2    8/2006 Ditewig et al.
(Continued)

FOREIGN PATENT DOCUMENTS

CN    103955446 A    7/2014
KR    10-0537116 B1  12/2005
(Continued)

OTHER PUBLICATIONS

Communication dated Feb. 15, 2017 issued by the European Patent Office in counterpart European Patent Application No. 16193553.1.
(Continued)

*Primary Examiner* — John Strege
(74) *Attorney, Agent, or Firm* — Sughrue Mion, PLLC

(57) ABSTRACT

Provided are an apparatus and method for performing a Fourier transform. A method of performing a Fourier transform may include generating intermediate data by performing a one-dimensional fast Fourier transform (1D FFT) on data in a column direction, storing the intermediate data in a cell array in the column direction, reading out the intermediate data from the cell array in a row direction; and generating final data by performing a 1D FFT on the read-out intermediate data.

18 Claims, 9 Drawing Sheets

(51) Int. Cl.
*G06F 17/14* (2006.01)
*G03H 1/08* (2006.01)
*G11C 13/00* (2006.01)

(52) U.S. Cl.
CPC ...... *G11C 11/1653* (2013.01); *G11C 11/1657* (2013.01); *G11C 11/1659* (2013.01); *G11C 11/1673* (2013.01); *G11C 11/1675* (2013.01); *G06T 2207/20056* (2013.01); *G11C 11/161* (2013.01); *G11C 13/003* (2013.01); *G11C 13/0028* (2013.01); *G11C 2213/74* (2013.01); *G11C 2213/79* (2013.01); *G11C 2213/82* (2013.01)

(58) Field of Classification Search
CPC ............ G11C 11/1675; G11C 11/1659; G11C 11/161; G11C 11/1657; G11C 13/0028; G11C 13/003; G11C 2213/74; G11C 2213/79; G11C 2213/82; G06F 17/142
See application file for complete search history.

(56) References Cited

U.S. PATENT DOCUMENTS

| | | |
|---|---|---|
| 7,405,962 B2 | 7/2008 | Kajiyama |
| 7,535,754 B2 | 5/2009 | Perner et al. |
| 9,317,480 B2 * | 4/2016 | Baksheev ............. G06F 17/142 |
| 2003/0195938 A1 * | 10/2003 | Howard .................... G06F 8/45 709/208 |
| 2005/0265082 A1 | 12/2005 | Campbell et al. |
| 2008/0028013 A1 * | 1/2008 | Kamegawa ........... G06F 17/142 708/400 |
| 2010/0017450 A1 | 1/2010 | Sun et al. |
| 2011/0002019 A1 * | 1/2011 | Routley ................. G02B 27/48 359/9 |
| 2011/0097009 A1 * | 4/2011 | Chouly .................... G06T 5/003 382/260 |
| 2014/0063922 A1 | 3/2014 | Kim et al. |
| 2015/0092479 A1 * | 4/2015 | Dong .................... G11C 7/1075 365/158 |
| 2017/0103793 A1 * | 4/2017 | Park ...................... G11C 11/165 |

FOREIGN PATENT DOCUMENTS

| | | |
|---|---|---|
| KR | 10-2015-0052187 A | 5/2015 |
| WO | 2014/119537 A1 | 8/2014 |

OTHER PUBLICATIONS

Stefan Langemeyer et al; "Using SDRAMs for two-dimensional accesses of long 2n×2m-point FFTs and transposing"; IEEE 2011 International Conference on Embedded Computer Systems (SAMOS); Jul. 18, 2011; pp. 242-248; XP032460588; 7 pgs. total.

* cited by examiner

APPARATUS AND METHOD FOR PERFORMING FOURIER TRANSFORM

CROSS-REFERENCE TO RELATED APPLICATION

This application claims the benefit of Korean Patent Application No. 10-2015-0143044, filed on Oct. 13, 2015, in the Korean Intellectual Property Office, the disclosure of which is incorporated herein in its entirety by reference.

BACKGROUND

1. Field

Apparatuses and methods consistent with exemplary embodiments relate to an apparatus and method for performing the Fourier transform.

2. Description of the Related Art

Recently, various technologies for displaying three dimensional (3D) images have been developed. A research of an apparatus embodying a high image quality hologram in real time using a complex spatial light modulator (SLM) capable of simultaneously controlling amplitude and phase of light has been actively conducted.

To reproduce a hologram moving picture, a computer generated hologram (CGH) is used. An image processing apparatus calculates a hologram value of each position on a hologram plane, and an amount of calculations is quite huge. In other words, to represent one point in space, the image processing apparatus performs the Fourier transform once. Accordingly, in order to represent an image in the space, the Fourier transform should be performed as many times as the number of pixels.

The image processing apparatus, such as TVs, mobile devices, etc. may process image data to reproduce a hologram image. In this case, the image processing apparatus may perform the Fourier transform on the image data and reproduce an image using transformed data.

When the image processing apparatus performs the Fourier transform, a large amount of calculations and a large amount of time are needed. In particular, portable devices, such as mobile devices, are limited in their sizes and usable powers. Accordingly, there is a demand for a method for reducing a calculation amount and time when the Fourier transform is performed.

SUMMARY

One or more exemplary embodiments may provide a memory for storing and reading out data when the Fourier transform is performed.

Additional exemplary aspects will be set forth in part in the description which follows and, in part, will be apparent from the description, or may be learned by practice of the exemplary embodiments.

According to an aspect of an exemplary embodiment, there is provided a method of performing a Fourier transform including: generating intermediate data by performing a one-dimensional fast Fourier transform (1D FFT) on data in a column direction, storing the intermediate data in a cell array in the column direction, reading out the intermediate data from the cell array in a row direction; and generating final data by performing a 1D FFT on the read-out intermediate data.

The storing of the intermediate data in the cell array may include activating one vertical word line of the cell array, activating one or more horizontal word lines connected to cells in which the intermediate data is to be stored, among cells connected to the active vertical word line, and storing the intermediate data in a write line to the cell connected to the active horizontal word line.

The reading out of the intermediate data from the cell array in the row direction may include activating one horizontal word line of the cell array, activating one or more vertical word lines connected to cells in which the intermediate data is to be read out, among cells connected to the active horizontal word line, and reading out the intermediate data through a read line from a cell connected to the active vertical word line.

The intermediate data may be stored in the cell array by changing a spin direction of a free layer of a magnetic tunnel junction (MTJ) in each cell.

The intermediate data stored in the cell may be read out from the cell array by measuring a resistance of each cell of the cell array.

Each pixel value of the intermediate data may include a plurality of bits, and the plurality of bits are stored in different cell arrays.

According to an aspect of another exemplary embodiment, there is provided a method of performing a Fourier transform including: generating intermediate data by performing a one-dimensional fast Fourier transform (1D FFT) on data in a row direction, storing the intermediate data in a cell array in the row direction, reading out the intermediate data from the cell array in a column direction, and generating final data by performing a 1D FFT on the read-out intermediate data.

According to an aspect of another exemplary embodiment, there is provided an image processing apparatus for performing a Fourier transform including: a first core configured to generate intermediate data by performing a one-dimensional fast Fourier transform (1D FFT) on data in a column direction, a memory configured to store the intermediate data in a cell array in the column direction and read out the intermediate data from the cell array in the row direction, and a second core configured to generate final data by performing a 1D FFT on the read-out intermediate data.

The memory may include a write driver and a read sense amplifier. The write driver may be configured to store the intermediate data in the cell array by applying a voltage or current to the cell array, and the read sense amplifier may be configured to read out the stored intermediate data by measuring resistance of each cell of the cell array by applying a voltage or current to the cell array.

Each cell of the memory may include two transistors and one magnetic tunnel junction (MTJ), and the intermediate data is stored according to a spin direction of the MTJ.

The memory may include a plurality of cell arrays, each pixel value of the intermediate data may include a plurality of bits, and the memory stores the plurality of bits in different cell arrays.

The image processing apparatus may further include a plurality of input pins which connect the first core and the memory, wherein a number of the cell arrays is a multiple of a number of the input pins.

The image processing apparatus may further include a plurality of output pins which connect the second core and the memory, wherein a number of the cell arrays is a multiple of a number of the output pins.

According to an aspect of another exemplary embodiment, there is provided an image processing apparatus for performing a Fourier transform including: a first core configured to generate intermediate data by performing a one-dimensional fast Fourier transform (1D FFT) on data in a row direction, a memory configured to store the intermediate data in a cell array in the row direction and read out the intermediate data from the cell array in the column direction, and a second core configured to generate final data by performing a 1D FFT on the read-out intermediate data.

According to an aspect of another exemplary embodiment, there is provided a non-transitory computer readable storage medium having stored thereon a program, which when executed by a computer, performs the above method.

According to an aspect of another exemplary embodiment, there is provided an apparatus for performing a Fourier transform including: a memory comprising a plurality of cell arrays, at least two cores configured to generate intermediate data by performing a one-dimensional fast Fourier transform (1D FFT) on data, each core performing 1D FFT in different directions, wherein the memory is configured to store the intermediate data in a cell array in a first direction and read out the intermediate data from the cell array in a second direction which is perpendicular to the first direction.

The memory may store the intermediate data in a column direction and read out the stored intermediate data in a row direction, or the memory may store the intermediate data in a row direction and read out the stored intermediate data in a column direction.

The memory may include a write driver and a read sense amplifier, and the write driver may store the intermediate data in the cell array by applying a voltage or current to the cell array, and the read sense amplifier may read out the stored intermediate data by measuring resistance of each cell of the cell array by applying a voltage or current to the cell array.

Each cell of the memory may include two transistors and one magnetic tunnel junction (MTJ) including a free layer, and the intermediate data may be stored in the cell array by changing a spin direction of the free layer of the MTJ, and the intermediate data may be read out from the cell array by measuring a resistance of each cell of the cell array.

The intermediate data and the memory may be two-dimensional matrix formats, and the intermediate data may be stored in the memory at a position corresponding to a position of each data of the intermediate data.

BRIEF DESCRIPTION OF THE DRAWINGS

The above and/or other aspects will become apparent and more readily appreciated from the following description of the exemplary embodiments, taken in conjunction with the accompanying drawings in which.

DETAILED DESCRIPTION OF EXEMPLARY EMBODIMENTS

Figure 1:
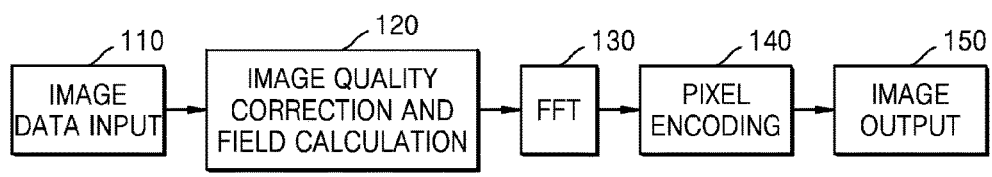
FIG. 1 is a flowchart of a process of processing image data.

Reference will now be made in detail to exemplary embodiments, examples of which are illustrated in the accompanying drawings, wherein like reference numerals refer to like elements throughout. Also, the size of each layer illustrated in the drawings may be exaggerated for convenience of explanation and clarity. In this regard, the exemplary embodiments may have different forms and should not be construed as being limited to the descriptions set forth herein. Accordingly, the exemplary embodiments are merely described below, by referring to the figures, to explain aspects of the present description. In a layer structure, when a constituent element is disposed "above" or "on" to another constituent element, the constituent element may be only directly on the other constituent element or above the other constituent elements in a non-contact manner.

FIG. 1 is a flowchart of a process of processing image data. Referring to FIG. 1, an image processing apparatus may receive image data and output an image.

In operation 110, the image processing apparatus receives image data. For example, in a computer-generated holography (CGH) operation, when a layer-based algorithm is applied to image data, the image data may be color data or depth data. The color data may be data indicating a plurality of colors for each plane. The layer-based algorithm is a method of dividing a reproduction area of a hologram based on a depth and processing data of each divided plane. The image processing apparatus may generate a hologram image by performing the Fourier transform or the inverse Fourier transform on data of each divided plane.

In operation 120, the image processing apparatus performs image quality correction and field calculation. The image processing apparatus may correct image data to improve image quality of the image data.

In operation 130, the image processing apparatus performs the Fourier transform or the fast Fourier transform (FFT). For example, the image processing apparatus may perform the Fourier transform on image data in a two-dimensional (2D) matrix form. The image processing apparatus may perform a one-dimensional (1D) Fourier transform twice for a 2D Fourier transform. The image processing apparatus may perform a 1D Fourier transform on image data in a row direction and a 1D Fourier transform on the transformed image data in a column direction. The image processing apparatus generates a holographic image through the Fourier transform.

In operation 140, the image processing apparatus performs a pixel encoding, and generates data to be input to a screen through the pixel encoding.

In operation 150, the image processing apparatus outputs an image to an image display apparatus.

The image processing apparatus may include a plurality of cores capable of parallelly performing the Fourier transform on image data. For example, the image processing apparatus may assign image data of each plane to the cores, and the image data assigned to the cores are Fourier transformed.

Figure 2:
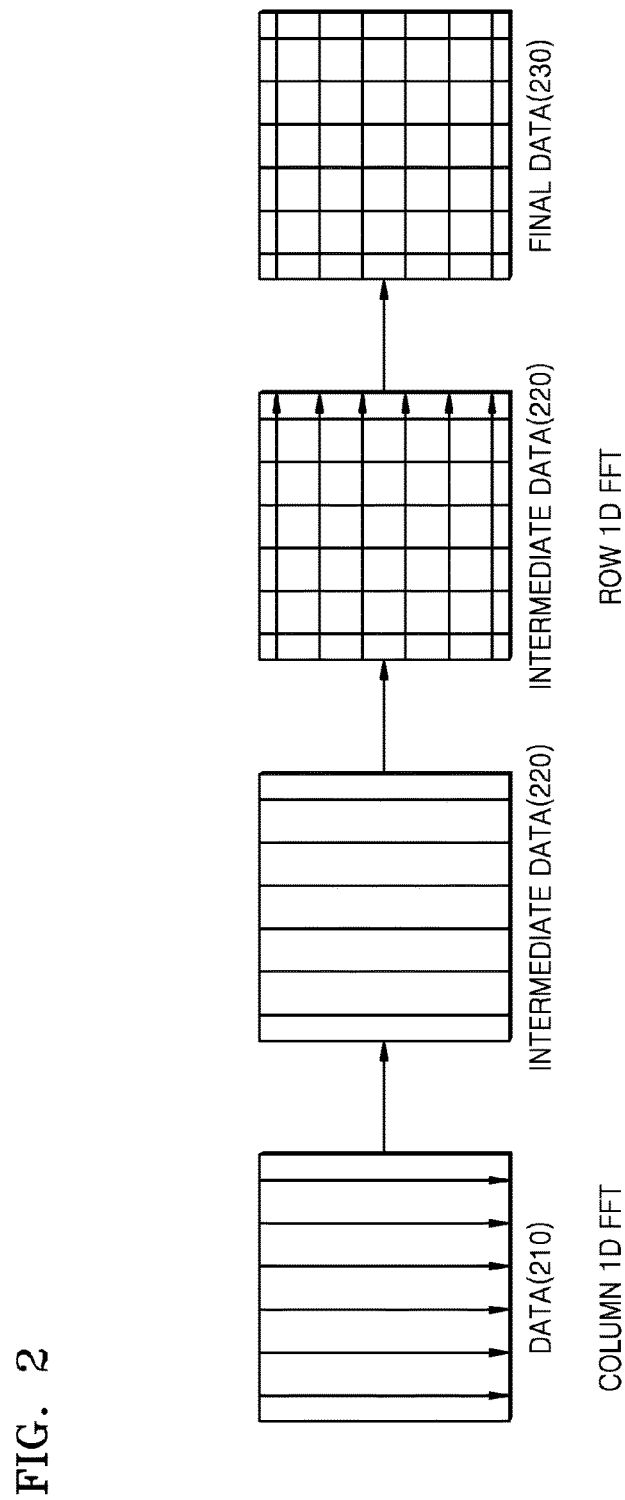
FIG. 2 illustrates a process of transforming data.

FIG. 2 illustrates a process of transforming data. Referring to FIG. 2, the image processing apparatus or a Fourier transform apparatus generates final data 230 by performing 1D FFT (fast Fourier transform) twice on data 210. For example, the image processing apparatus performs 1D FFT on the data 210 once in a row direction and 1D FFT on the data 210 once in a column direction, thereby generating the final data 230. Alternatively, the image processing apparatus performs 1D FFT on the data 210 once in the column direction and 1D FFT on the data 210 once in the row direction, thereby generating the final data 230.

In FIG. 2, a case in which the image processing apparatus first performs 1D FFT on the data 210 in the column direction is described.

The image processing apparatus performs 1D FFT on the data 210 in the column direction, and intermediate data 220 is obtained as a result of performing 1D FFT on the data 210 in the column direction. Arrows marked on the data 210 indicate directions in which the image processing apparatus performs 1D FFT. Straight lines marked on the intermediate data 220 indicate directions in which the data 210 is transformed.

The image processing apparatus stores the intermediate data 220 in a memory (not shown). The image processing apparatus stores the intermediate data 220 in the memory in the same direction as a direction in which the 1D FFT is performed. When reading out the intermediate data 220 stored in the memory, the image processing apparatus reads out the intermediate data 220 in a direction perpendicular to the direction in which the 1D FFT is performed. In other words, the image processing apparatus reads out the intermediate data 220 stored in the memory in the row direction. Because the intermediate data 220 is stored in the memory in the same format as a format in which the 1D FFT is performed, in order to perform 1D FFT in the row direction, the intermediate data 220 stored in the memory is read out in the row direction. For example, if both the intermediate data 220 and the memory are 2D matrices, the intermediate data 220 is stored in the memory at a position corresponding to a position of each data of the intermediate data 220. Accordingly, no address calculation to calculate the position of the intermediate data 220 that is stored is needed.

The image processing apparatus performs 1D FFT on the intermediate data 220 that is read out from the memory, in the row direction. When the image processing apparatus reads out the intermediate data 220 stored in the memory, in the row direction, the image processing apparatus reads out data from the memory in the row direction. For example, when the image processing apparatus reads out the second row data of the intermediate data 220, the image processing apparatus reads out the second row data of the memory. Accordingly, the image processing apparatus reads out the intermediate data 220 stored in the memory in the row direction without a separate address calculation, and then performs 1D FFT on the read-out data. The final data 230 is obtained as a result of performing 1D FFT on the intermediate data 220 in the row direction. Arrows marked on the intermediate data 220 indicate directions in which the image processing apparatus performs 1D FFT.

Although FIG. 2 illustrates that, after 1D FFT is performed on the data 210 in the column direction, 1D FFT is performed on the intermediate data 220 in the row direction, but is not limited thereto, and a case in which, after 1D FFT is performed on the data 210 in the row direction, 1D FFT is performed on the intermediate data 220 in the column direction may be possible.

Figure 3:
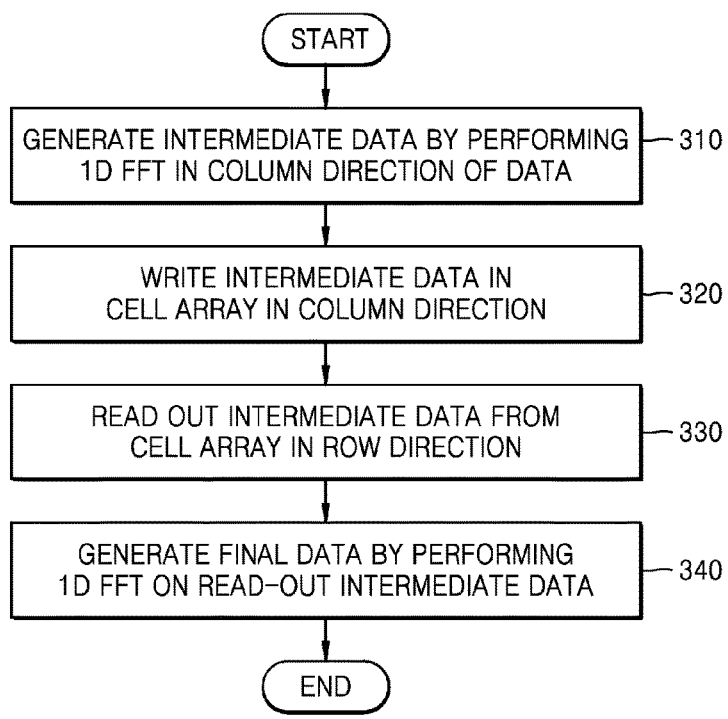
FIG. 3 is a flowchart of a Fourier transform method according to an exemplary embodiment.

FIG. 3 is a flowchart of a method of performing a Fourier transform method according to an exemplary embodiment.

In operation 310, the image processing apparatus may generate intermediate data by performing 1D FFT in the column direction of data. The data and the intermediate data may be in a 2D matrix form, and the image processing apparatus performs 1D FFT on each column of the data.

In operation 320, the image processing apparatus may write the intermediate data in the column direction to a cell array. Writing data to a cell array may refer to store the data in the cell array. The cell array may be in an N×M matrix form and include N×M cells. The image processing apparatus may activate cells located in any one column and write the intermediate data to active cells. Each cell may store 1 bit data. The image processing apparatus may apply a voltage to the active cells, thereby storing 1 bit data which indicates 0 or 1. The image processing apparatus may perform 1D FFT on all columns of the data and write the generated intermediate data in the column direction to the cell array.

In operation 330, the image processing apparatus may read out the intermediate data stored in the cell array, in the row direction. The image processing apparatus may activate cells of any one row and read out the intermediate data stored in the active cells. The cell array may store the intermediate data using a magnetic tunnel junction (MTJ). The image processing apparatus may measure resistance of an active cell by applying a current or a voltage to the active cell. The image processing apparatus may determine whether a value stored in the active cell is 0 or 1 according to the size of a measured resistance value.

In operation 340, the image processing apparatus may generate final data by performing 1D FFT on the read-out intermediate data. As the image processing apparatus reads out the intermediate data in the row direction and performs 1D FFT on the read-out intermediate data, the image processing apparatus stores the final data in a buffer in the row direction.

Figure 4:
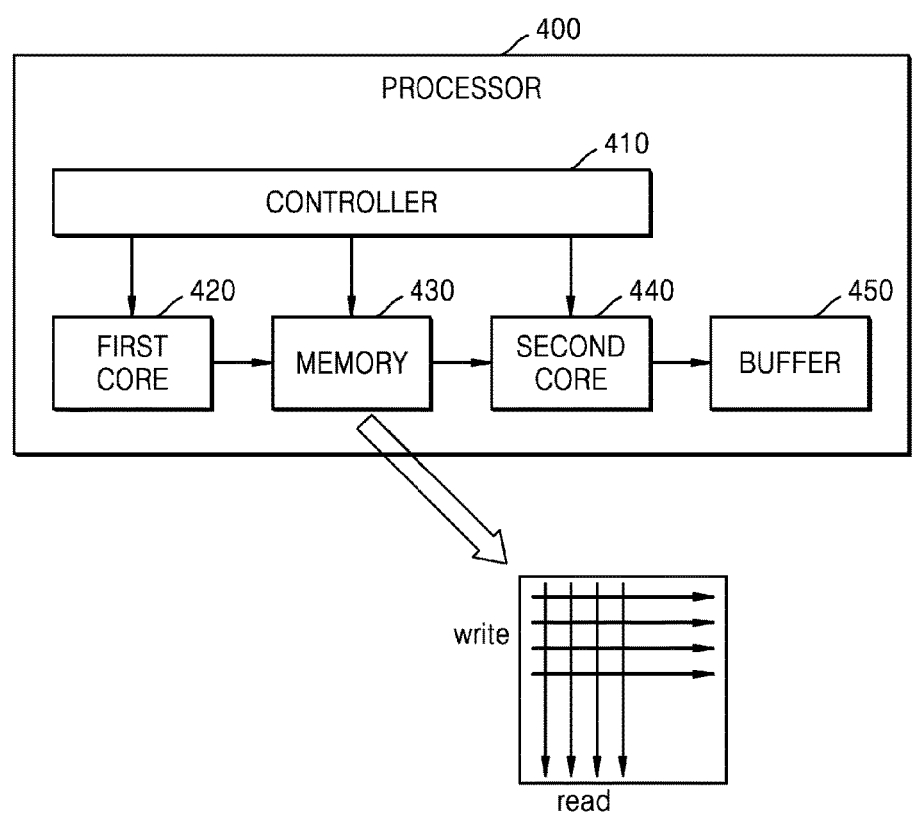
FIG. 4 is a block diagram of an example of an image processing apparatus.

FIG. 4 is a block diagram of an example of the image processing apparatus. Referring to FIG. 4, a processor 400 may be an example of the image processing apparatus or the Fourier transform apparatus.

The processor 400 may include a controller 410, a first core 420, a memory 430, a second core 440, and a buffer 450. Although FIG. 4 illustrates that the processor 400 includes two cores 420 and 440, it is not limited thereto, and the processor 400 may include two or more cores.

The controller 410 controls the first core 420, the memory 430, and the second core 440. The controller 410 may designate a calculation performed by the first and second cores 420 and 440. For example, the controller 410 may control the first core 420 to perform 1D FFT on data in the row direction or in the column direction.

The controller 410 may control the second core 440 to perform 1D FFT on the data in the row direction or in the column direction.

The first core 420 may perform the Fourier transform on the data. For example, the first core 420 may perform 1D FFT on the data in the row direction or in the column direction, thereby generating the intermediate data. The first core 420 may output the intermediate data to the memory 430.

The memory 430 may store and output the intermediate data in different directions. Because the first core 420 and the second core 440 perform 1D FFT in different directions, a direction to store the intermediate data in the memory 430 and a direction to output the intermediate data are different from each other.

For example, the memory 430 may store the intermediate data in the row direction and output the stored intermediate data in the column direction. Alternatively, the memory 430 may store the intermediate data in the column direction and output the stored intermediate data in the row direction. When the first core 420 performs 1D FFT on data in the row direction, the memory 430 stores the intermediate data in the row direction. In this case, because the second core 440 performs 1D FFT on the intermediate data in the column direction, the memory 430 outputs the intermediate data in the column direction.

The second core 440 may perform the Fourier transform on data. For example, the second core 440 may perform 1D FFT on image data in the column direction or in the row direction. When the first core 420 performs 1D FFT on data in the row direction, the second core 440 performs 1D FFT on the intermediate data in the column direction.

Figure 5:
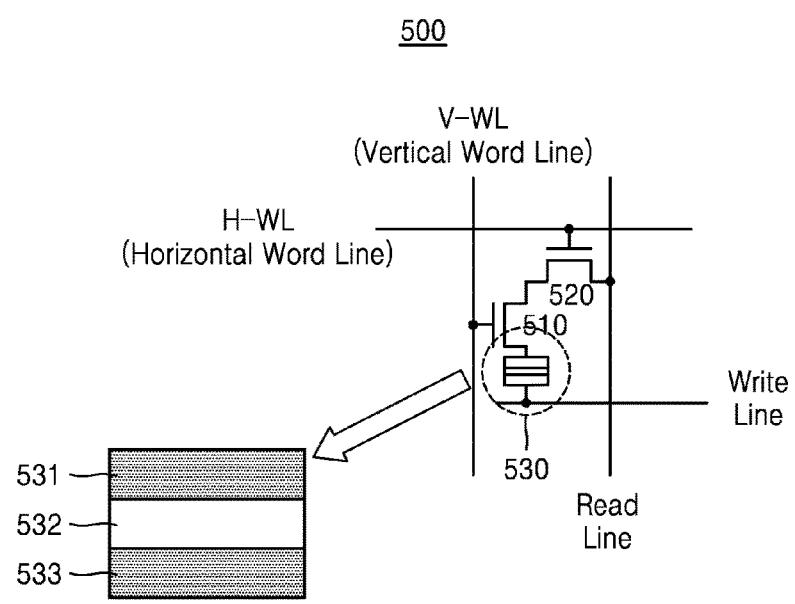
FIG. 5 illustrates a cell of a memory according to an exemplary embodiment.

FIG. 5 illustrates a cell of the memory according to an exemplary embodiment. Referring to FIG. 5, a cell 500 may include two transistors 510 and 520 and one MTJ 530. The first transistor 510 is connected to a vertical word line V-WL and the second transistor 520 is connected to a horizontal word line H-WL. The cell 500 is active when a voltage is applied to both of V-WL and H-WL.

The MTJ 530 may include a free layer 531, a tunnel barrier 532, and a pinned layer 533. A spin direction of the pinned layer 533 does not change, whereas a spin direction of the free layer 531 changes. Accordingly, the free layer 531 stores data. Resistance values of the MTJ 530 measured when the spin directions of the free layer 531 and the pinned layer 533 are the same or opposite to each other are different. Accordingly, data may be read out using the resistance value of the MTJ 530.

Data may be stored in the MTJ 530 by applying a voltage to a write line in a state in which the cell 500 is active. When a voltage is applied to a write line, the spin direction of the free layer 531 is determined according to an amount of the voltage.

Resistance of a cell may be measured through a read line in a state in which the cell 500 is active. For example, the resistance of the cell 500 may be measured by applying a current to the read line and measuring a voltage on the read line. The amount of the current or voltage applied to the read line may be a current or voltage having an amount that does not affect the spin of the MTJ 530.

Figure 6:
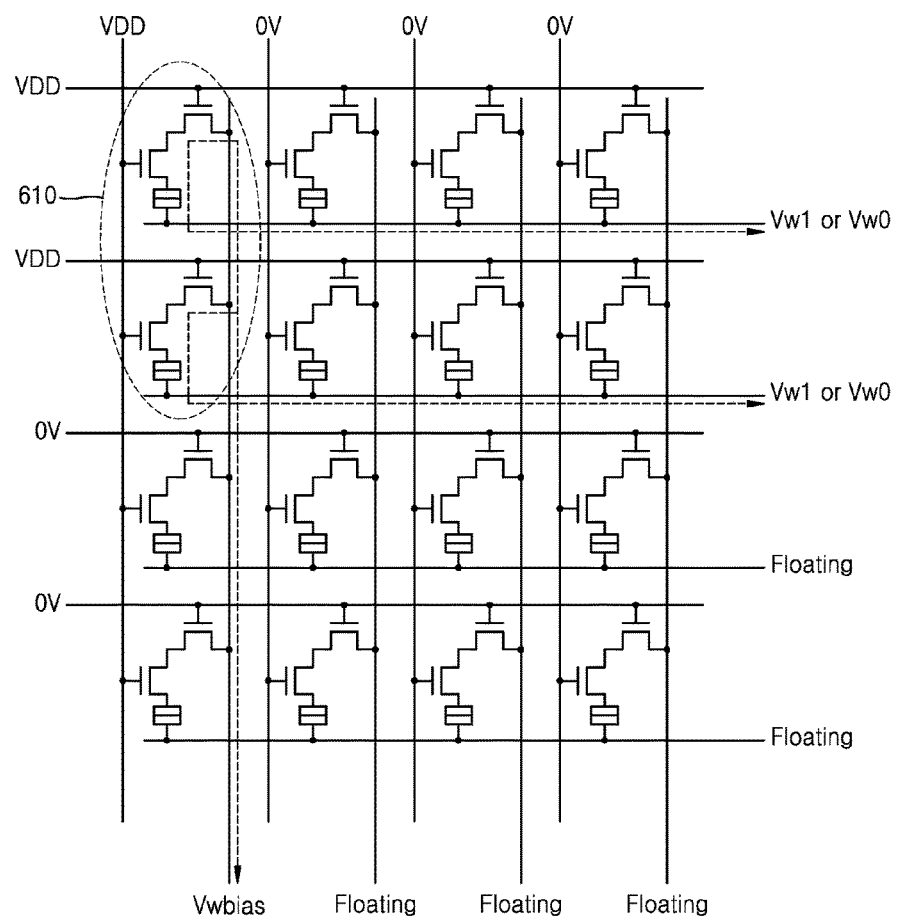
FIG. 6 illustrates a method of wiring data according to an exemplary embodiment.

FIG. 6 illustrates a method of wiring data according to an exemplary embodiment. Referring to FIG. 6, the memory 430 may write data to a plurality of cells in the column direction. The first core 420 may perform 1D FFT on the data in the column direction. In this case, the memory 430 may store the intermediate data received from the first core 420, in the column direction. In other words, the memory 430 may store the intermediate data in the cells in the same direction as the direction in which the first core 420 performs 1D FFT.

VDD is a voltage applied to select a cell to be activated. Vw1 denotes a voltage indicating data 1, and Vw0 is a voltage indicating data 0. Vwbias denotes a bias voltage applied to a cell to write data to the cell.

FIG. 6 illustrates an example of writing data to two left cells 610. When the memory 430 writes data to the two left cells 610, VDD is applied to H-WL and V-WL connected to the two cells 610 and Vwbias is applied to a read line connected to the two cells 610 to activate the cells 610. The image processing apparatus activates a first vertical word line of the cell array and first and second horizontal word lines connected to the cells 610 in which the data is to be stored, among cells connected to the first vertical word line which is active. When VDD and Vwbias are applied the read line, the memory 430 writes data to the two cells 610 by applying Vw1 or Vw0 through first and second write lines.

Figure 7:
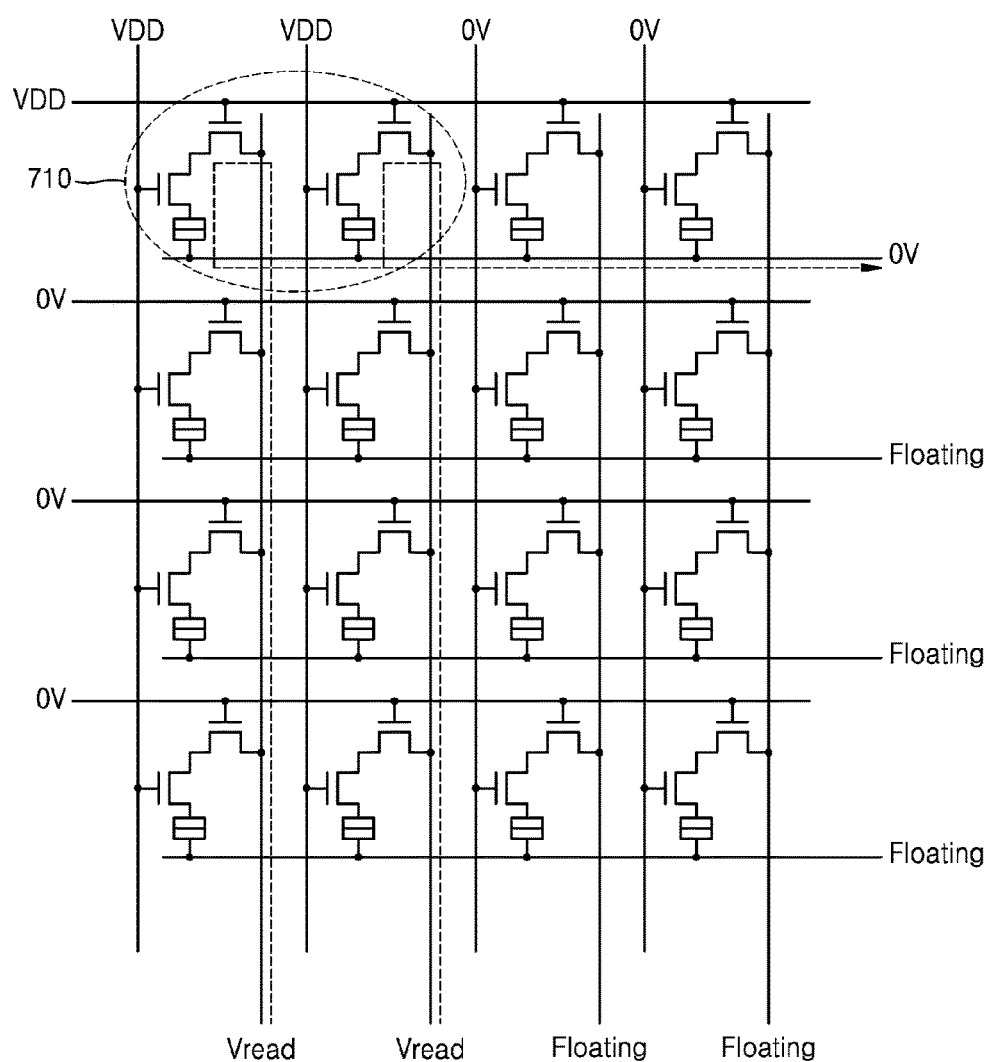
FIG. 7 illustrates a method of reading out data according to an exemplary embodiment.

FIG. 7 illustrates a method of reading out data according to an exemplary embodiment. Referring to FIG. 7, the memory 430 may read out data from a plurality of cells in the row direction. The second core 440 may perform 1D FFT on the intermediate data in the row direction. In this case, the memory 430 outputs the intermediate data in the row direction to the second core 440. Accordingly, the memory 430 reads out the intermediate data stored in the cells in the row direction and outputs the read-out intermediate data to the second core 440.

FIG. 7 illustrates a method of reading out data stored in two left cells 710 according to an exemplary embodiment. The memory 430 reads out data from the two cells 710. VDD is applied to H-WL and V-WL connected to the two cells 710, and 0 V (zero voltage) is applied to a write line connected to the two cells 710. When VDD and 0 V are applied to the write line, the memory 430 reads out the data stored in the two cells 710 by applying Vread to two read lines. The memory 430 outputs the read-out data to the second core 440.

Figure 8:
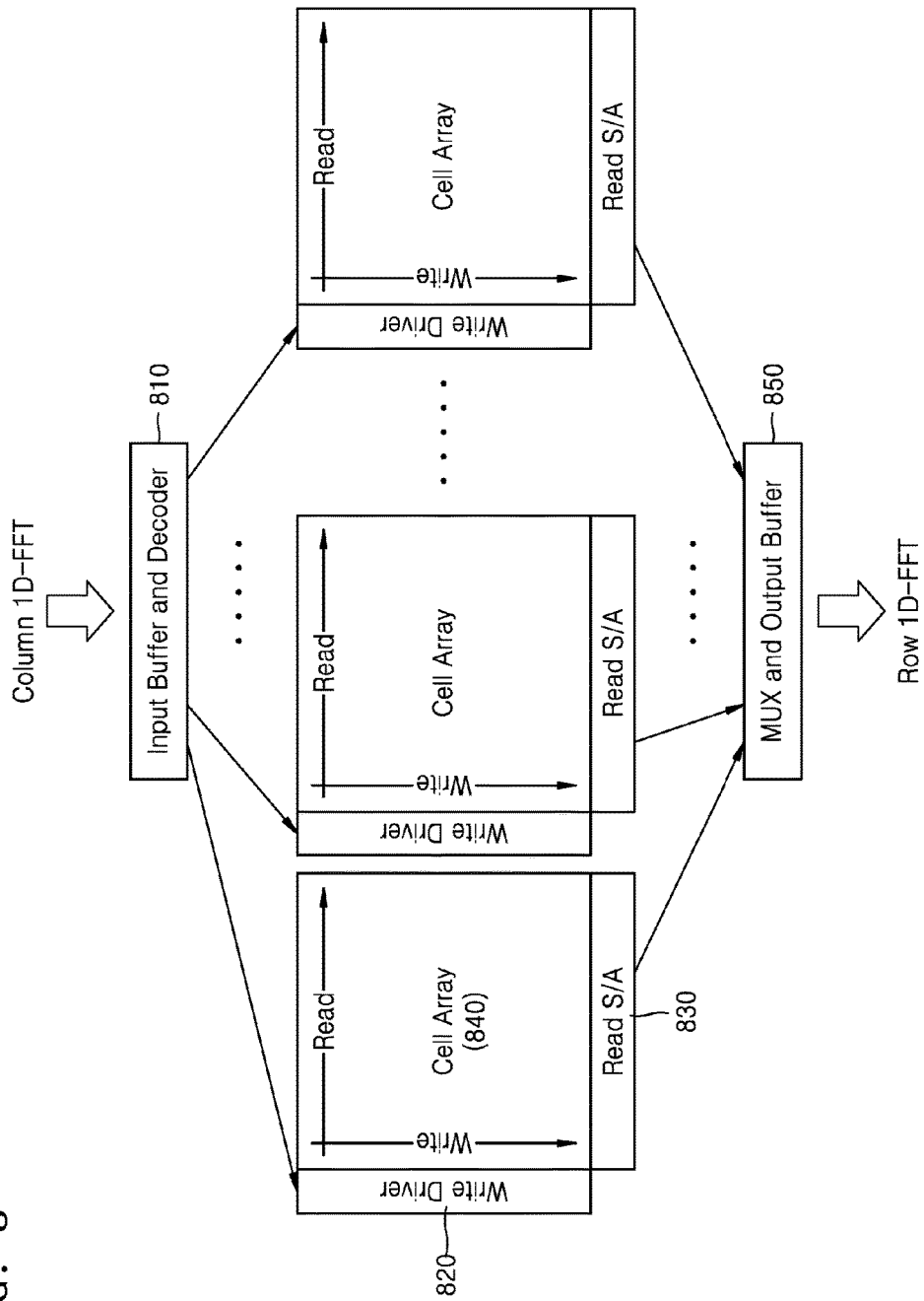
FIG. 8 illustrates a method of storing data according to an exemplary embodiment.

FIG. 8 illustrates a method of storing data according to an exemplary embodiment. FIG. 8 illustrates a case in which the first core 420 performs 1D FFT in the column direction and the second core 440 performs 1D FFT in the row direction. Accordingly, the memory 430 writes the intermediate data in the column direction and reads out the intermediate data in the row direction.

Alternatively, when the first core 420 performs 1D FFT in the row direction and the second core 440 performs 1D FFT in the column direction, the memory 430 writes the intermediate data in the row direction and reads out the intermediate data in the column direction.

The number of cell arrays 840 may be a multiple of the number of input/output (I/O) pins. An input pin connects the first core 420 and an input buffer and decoder 810, and an output pin connects the second core 440 and a multiplexer (MUX) and output buffer 850. For example, when there are sixteen (16) input pins, the number of the cell arrays 840 may be 16, 32, or 64.

The input buffer and decoder 810 receives the intermediate data from the first core 420, stores the received intermediate data in the memory 430, and outputs the intermediate data to each of a plurality of write drivers 820.

The input buffer and decoder 810 outputs bits corresponding to one pixel value to each of the write drivers 820. If a pixel value is 8 bits, the input buffer and decoder 810 outputs each bit to eight (8) write drivers 820 and the pixel values of 8 bits are stored in eight (8) cell arrays 840.

The write driver 820 writes the intermediate data received from the input buffer and decoder 810 to the cell arrays 840. The write driver 820 activates cells in the column direction of the cell arrays 840 and writes the intermediate data to the active cells. Accordingly, the form of the intermediate data generated by the first core 420 and the form of the intermediate data stored in the cell arrays 840 are same. Accordingly, no separate address calculation is needed for a read sense amplifier (S/A) 830 to read out the intermediate data stored in the cell arrays 840 in the row direction. The read S/A 830 sequentially reads out the data stored in the cell arrays 840 in the row direction.

The read S/A 830 reads out the data stored in the cell arrays 840 in the row direction. The read S/A 830 may activate cells in the row direction of the cell arrays 840 and measure resistance of each cell. The read S/A 830 acquires the data stored in each cell according to the amount of a resistance value of each cell.

A MUX and output buffer 850 receives the data read out from the cell arrays 840 and outputs the received data to the second core 440.

Figure 9:
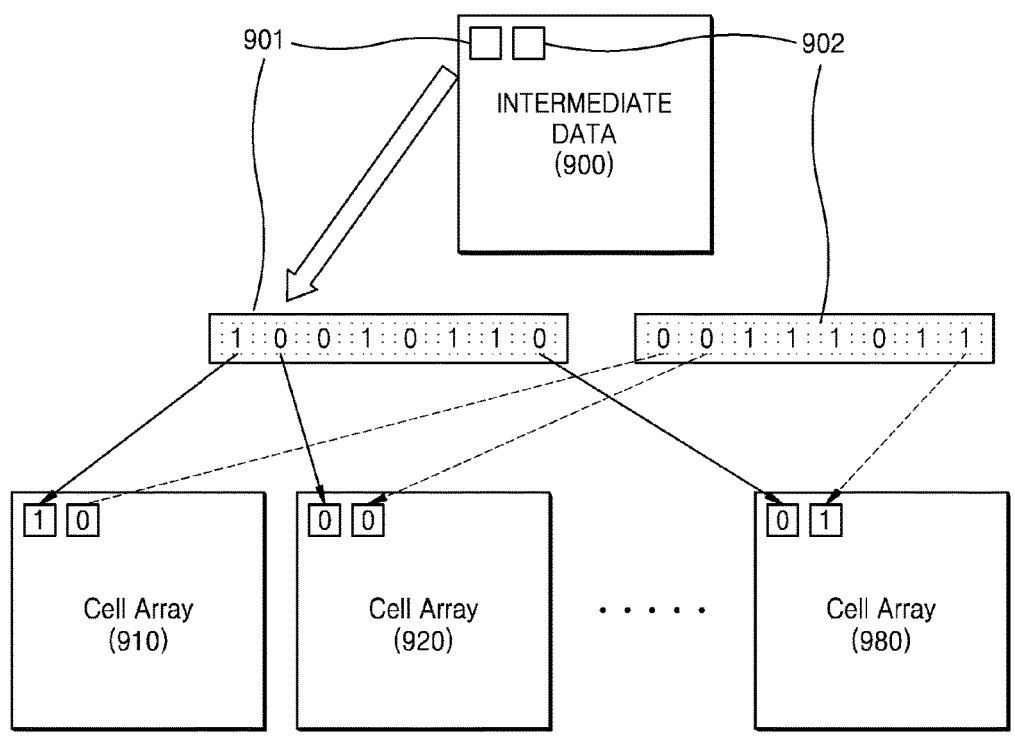
FIG. 9 illustrates a method of storing intermediate data in a cell array.

FIG. 9 illustrates a method of storing intermediate data in a cell array. The intermediate data is data on which 1D FFT is performed once in the row direction or in the column direction. A pixel value denotes data stored in one pixel.

When a first pixel value 901 is "10010110", the first pixel value 901 is stored in eight (8) cell arrays 910 to 980. Each bit may be stored at the same location in the respective cell arrays. For example, the first bit "1" of the first pixel value 901 is stored in the first cell array 910, the second bit "0" in the second cell array 920, and the final bit "0" in the eighth cell array 980.

When a second pixel value 902 is "00111011", the second pixel value 902 is stored in the eight cell arrays 910 to 980. When the second pixel value 902 is a pixel value located at the right of the first pixel value 901, each bit of the second pixel value 902 is stored in a cell at the right of each bit of the first pixel value 901. As illustrated in FIG. 9, the first bit "0" of the second pixel value 902 is stored in the first cell array 910 at the right of the first bit of the first pixel value 901, the second bit "0" in the second cell array 920 at the right of the second bit of the first pixel value 901, and the final bit "1" in the eighth cell array 980 at the right of the final bit of the first pixel value 901.

While not restricted thereto, an exemplary embodiment can be embodied as computer-readable codes in a computer-readable recording medium that includes program instructions to be implemented by a computer to cause a processor to execute or perform the program instructions. The medium may also include, alone or in combination with the program instructions, data files, data structures, and the like. The computer-readable recording medium may include any kind of recording devices for storing data which can be thereafter read by a computer system. Examples of the computer-readable recording medium include magnetic storage media (e.g., ROM, RAM, floppy disks, hard disks, etc.), and optical recording media (e.g., CD-ROMs, digital versatile disks (DVDs), etc.). The described hardware devices may be configured to act as one or more software modules in order to perform the operations and methods described above, or vice versa. In addition, the computer-readable recording medium may be distributed over network coupled computer systems so that the computer-readable code is stored and executed in a distributive manner.

Also, an exemplary embodiment may be written as a computer program transmitted over a computer-readable transmission medium, such as a carrier wave, and received and implemented in general-use or special-purpose digital computers that execute the programs. Moreover, it is understood that in exemplary embodiments, one or more units of the above-described apparatuses and devices can include circuitry, a processor, a microprocessor, etc., and may execute a computer program stored in a computer-readable medium.

At least one of the components, elements or units represented by a block as illustrated in the above diagrams may be embodied as various numbers of hardware, software and/or firmware structures that execute respective functions described above, according to an exemplary embodiment. Also, at least one of these components, elements or units may be specifically embodied by a module, a program, or a part of code, which contains one or more executable instructions for performing specified logic functions. Also, at least one of these components, elements or units may further include a processor such as a central processing unit (CPU) that performs the respective functions, a microprocessor, or the like. The exemplary embodiments may be described in terms of functional block components and various processing steps. Such functional blocks may be realized by any number of hardware and/or software components configured to perform the specified functions. For example, the exemplary embodiments may employ various integrated circuit (IC) components, e.g., memory elements, processing elements, logic elements, look-up tables, and the like, which may carry out a variety of functions under the control of one or more microprocessors or other control devices. Similarly, where the elements of the exemplary embodiments are implemented using software programming or software elements, the exemplary embodiments may be implemented with any programming or scripting language such as C, C++, Java, assembler language, or the like, with the various algorithms being implemented with any combination of data structures, objects, processes, routines or other programming elements. Functional aspects of the above exemplary embodiments may be implemented in algorithms that are executed on one or more processors. Furthermore, the exemplary embodiments may employ any number of related art techniques for electronics configuration, signal processing and/or control, data processing, and the like. The words "mechanism," "element," "means," and "configuration" are used broadly and are not limited to mechanical or physical embodiments, but may include software routines in conjunction with processors, etc.

The exemplary embodiments shown and described herein are illustrative examples of the inventive concept and are not intended to otherwise limit the scope of the inventive concept. For the sake of brevity, related art electronics, control systems, software development and other functional aspects of the systems may not be described in detail. Furthermore, the connecting lines, or connectors shown in the various figures are intended to represent exemplary functional relationships and/or physical or logical couplings between the various elements. It should be noted that various alternative or additional functional relationships, physical connections or logical connections may be present in a practical device. Moreover, no item or component is essential to the practice of the inventive concept unless the element is specifically described as "essential" or "critical."

The terminology used herein is for the purpose of describing particular embodiments only and is not intended to be limiting of exemplary embodiments. As use herein, the singular forms "a" and "an" and "the" may include the plural forms as well, unless the context clearly indicates otherwise. Furthermore, recitation of ranges of values herein are merely intended to serve as a shorthand method of referring individually to each separate value falling within the range, unless otherwise indicated herein, and each separate value is incorporated into the specification as if it were individually recited herein. In addition, the steps of all methods described herein may be performed in any suitable order unless otherwise indicated herein or otherwise clearly contradicted by context. The inventive concept is not limited to the described order of the steps. The use of any and all examples, or exemplary language (e.g., "such as") provided herein, is intended merely to better illuminate the inventive concept and does not pose a limitation on the scope of the inventive concept unless otherwise defined. Numerous modifications and adaptations will be readily apparent to one of ordinary skill in the art without departing from the spirit and scope of the present inventive concept.

As described above, a memory in which a direction to write data to the memory and a direction to read out the data are different from each other may be provided. The data may be stored and read out according to a direction of performing 1D FFT on the data.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the appended claims.

What is claimed is:

1. A method of performing a Fourier transform, the method comprising:
    generating intermediate data by performing a one-dimensional fast Fourier transform (1D FFT) on data in a column direction;
    storing the intermediate data in a cell array in the column direction;
    reading out the intermediate data from the cell array in a row direction;
    generating final data by performing a 1D FFT on the read-out intermediate data; and
    using, by an image processing apparatus, the final data for generating a three-dimensional (3D) image to be displayed on an image displaying apparatus,
    wherein the intermediate data is stored in the cell array by changing a spin direction of a free layer of a magnetic tunnel junction (MTJ) in each cell.

2. The method of claim 1, wherein the storing of the intermediate data in the cell array comprises:
    activating one vertical word line of the cell array;
    activating one or more horizontal word lines connected to cells in which the intermediate data is to be stored, among cells connected to the active vertical word line; and
    storing the intermediate data in a write line to the cell connected to the active horizontal word line.

3. The method of claim 1, wherein the reading out of the intermediate data from the cell array in the row direction comprises:
    activating one horizontal word line of the cell array;
    activating one or more vertical word lines connected to cells in which the intermediate data is to be read out, among cells connected to the active horizontal word line; and
    reading out the intermediate data through a read line from a cell connected to the active vertical word line.

4. The method of claim 1, wherein the intermediate data stored in the cell is read out from the cell array by measuring a resistance of each cell of the cell array.

5. The method of claim 1, wherein each pixel value of the intermediate data comprises a plurality of bits, and the plurality of bits are stored in different cell arrays.

6. A method of performing a Fourier transform, the method comprising:
    generating intermediate data by performing a one-dimensional fast Fourier transform (1D FFT) on data in a row direction;
    storing the intermediate data in a cell array in the row direction;
    reading out the intermediate data from the cell array in a column direction;
    generating final data by performing a 1D FFT on the read-out intermediate data; and
    using, by an image processing apparatus, the final data for generating a three-dimensional (3D) image to be displayed on an image displaying apparatus,
    wherein the intermediate data is stored in the cell array by changing a spin direction of a free layer of a magnetic tunnel junction (MTJ) in each cell.

7. An image processing apparatus for performing a Fourier transform, the image processing apparatus comprising:
    a first core configured to generate intermediate data by performing a one-dimensional fast Fourier transform (1D FFT) on data in a column direction;
    a memory configured to store the intermediate data in a cell array in the column direction and read out the intermediate data from the cell array in the row direction; and
    a second core configured to generate final data by performing a 1D FFT on the read-out intermediate data; and
    a processor configured to use the final data for generating a three-dimensional (3D) image to be displayed on an image displaying apparatus,
    wherein each cell of the memory comprises two transistors and one magnetic tunnel junction (MTJ) comprising a free layer, and the intermediate data is stored according to a spin direction of the free layer of the MTJ.

8. The image processing apparatus of claim 7, wherein the memory comprises a write driver and a read sense amplifier,
    wherein the write driver is configured to store the intermediate data in the cell array by applying a voltage or current to the cell array, and
    wherein the read sense amplifier is configured to read out the stored intermediate data by measuring resistance of each cell of the cell array by applying a voltage or current to the cell array.

9. The image processing apparatus of claim 7, wherein the memory comprises a plurality of cell arrays, each pixel value of the intermediate data comprises a plurality of bits, and the memory stores the plurality of bits in different cell arrays.

10. The image processing apparatus of claim 7, further comprising a plurality of input pins which connect the first core and the memory,
    wherein a number of the cell arrays is a multiple of a number of the input pins.

11. The image processing apparatus of claim 7, further comprising a plurality of output pins which connect the second core and the memory,
    wherein a number of the cell arrays is a multiple of a number of the output pins.

12. An image processing apparatus for performing a Fourier transform, the image processing apparatus comprising:
    a first core configured to generate intermediate data by performing a one-dimensional fast Fourier transform (1D FFT) on data in a row direction;
    a memory configured to store the intermediate data in a cell array in the row direction and read out the intermediate data from the cell array in the column direction;
    a second core configured to generate final data by performing a 1D FFT on the read-out intermediate data; and
    a processor configured to use the final data for generating a three-dimensional (3D) image to be displayed on an image displaying apparatus, wherein each cell of the memory comprises two transistors and one magnetic tunnel junction (MTJ) comprising a free layer, and the intermediate data is stored according to a spin direction of the free layer of the MTJ.

13. A non-transitory computer readable storage medium having stored thereon a program, which when executed by a computer, performs the method defined in claim 1.

14. An apparatus for performing a Fourier transform, the apparatus comprising:
- a memory comprising a plurality of cell arrays;
- at least two cores configured to generate intermediate data by performing a one-dimensional fast Fourier transform (1D FFT) on data, each core performing 1D FFT in different directions; and
- a processor configured to use the intermediate data for generating a three-dimensional (3D) image to be displayed on an image displaying apparatus,
- wherein the memory is configured to store the intermediate data in a cell array in a first direction and read out the intermediate data from the cell array in a second direction which is perpendicular to the first direction, and
- wherein each cell of the memory comprises two transistors and one magnetic tunnel junction (MTJ) comprising a free layer, and the intermediate data is stored according to a spin direction of the free layer of the MTJ.

15. The apparatus of claim 14, wherein the memory stores the intermediate data in a column direction and reads out the stored intermediate data in a row direction, or the memory stores the intermediate data in a row direction and reads out the stored intermediate data in a column direction.

16. The apparatus of claim 14, wherein the memory comprises a write driver and a read sense amplifier,
- wherein the write driver is configured to store the intermediate data in the cell array by applying a voltage or current to the cell array, and the read sense amplifier is configured to read out the stored intermediate data by measuring resistance of each cell of the cell array by applying a voltage or current to the cell array.

17. The apparatus of claim 14, wherein the intermediate data is read out from the cell array by measuring a resistance of each cell of the cell array.

18. The apparatus of claim 14, wherein the intermediate data and the memory are two-dimensional matrix formats, and the intermediate data is stored in the memory at a position corresponding to a position of each data of the intermediate data.

* * * * *